(12) United States Patent
Wagner et al.

(10) Patent No.: US 7,796,047 B2
(45) Date of Patent: Sep. 14, 2010

(54) APPARATUS FOR FIRE DETECTION IN AN ELECTRICAL EQUIPMENT RACK

(75) Inventors: Ernst Werner Wagner, Winsen (DE); Carsten Heller, Bad Salzdetfurth (DE)

(73) Assignee: Amrona AG, Zug (CH)

( * ) Notice: Subject to any disclaimer, the term of this patent is extended or adjusted under 35 U.S.C. 154(b) by 271 days.

(21) Appl. No.: 11/592,897

(22) Filed: Nov. 3, 2006

(65) Prior Publication Data

US 2007/0103325 A1 May 10, 2007

(30) Foreign Application Priority Data

Nov. 4, 2005 (DE) .............. 10 2005 052 777

(51) Int. Cl.
*G08B 17/10* (2006.01)
(52) U.S. Cl. .............. 340/628; 340/632; 340/584; 340/524; 340/693.5
(58) Field of Classification Search ......... 340/628–632, 340/584, 524, 693.5, 693.9, 603, 577, 578; 73/863.41, 863.51, 23.25, 23.26, 25.01; 169/61; 374/141, 147, 148; 236/DIG. 8, 49.2, 94; 454/28, 369; 431/16, 22; 122/504.2
See application file for complete search history.

(56) References Cited

U.S. PATENT DOCUMENTS

| | | | | |
|---|---|---|---|---|
| 4,819,733 A | * | 4/1989 | Aria et al. ............... | 169/61 |
| 5,537,096 A | * | 7/1996 | Wagner .................. | 340/693.6 |
| 5,552,775 A | * | 9/1996 | Harley .................... | 340/628 |
| 5,716,269 A | * | 2/1998 | Garbooshian ............ | 454/139 |
| 5,769,709 A | * | 6/1998 | Kim ....................... | 454/318 |
| 6,116,348 A | * | 9/2000 | Drakin .................... | 169/46 |
| 6,750,772 B2 | * | 6/2004 | Skerker et al. .......... | 340/585 |

FOREIGN PATENT DOCUMENTS

| | | |
|---|---|---|
| CA | 2538881 | 5/2005 |
| DE | 89 13 487 U1 | 4/1990 |
| DE | 196 05 712 C2 | 8/1997 |
| DE | 299 02 638 U1 | 7/1999 |
| DE | 203 17 604 U1 | 3/2004 |
| DE | 103 48 565 A1 | 5/2005 |
| EP | 1413997 | 10/2003 |
| FR | 2 523 455 A1 | 9/1983 |
| WO | WO03/069571 | 8/2003 |
| WO | WO2005/030338 | 4/2005 |

\* cited by examiner

*Primary Examiner*—Anh V La
(74) *Attorney, Agent, or Firm*—Cesari and McKenna, LLP

(57) ABSTRACT

An apparatus for fire detection in an electrical equipment rack includes a suction pipe system which communicates with the rack monitored through at least one suction opening and through which a representative air sample is drawn from the rack, an early fire detection module having at least one detector unit for detecting at least one fire parameter in the air sample extracted through the suction pipe system, and a controller for issuing an early fire detection signal in response to the result detected with the at least one detector unit. The early fire detection module is configured as a rackmount to be inserted into the rack.

20 Claims, 7 Drawing Sheets

APPARATUS FOR FIRE DETECTION IN AN ELECTRICAL EQUIPMENT RACK

BACKGROUND OF THE INVENTION

1. Field of the Invention

The present invention relates to an apparatus for fire detection in an electrical equipment rack comprising a suction pipe system which communicates with the electrical equipment rack to be monitored through at least one suction opening and through which a representative air sample is drawn from the electrical equipment rack to be monitored, an early fire detection module having at least one detector unit for detecting at least one fire parameter in the air sample extracted through the suction pipe system, and a controller for issuing a fire detection signal in response to the result detected with the at least one detector unit.

To be understood by the term "electrical equipment rack" as used here are all cabinets which accommodate electronic components or devices such as e.g. computer system racks, network racks, production control racks, electronic control racks or even telecommunication racks. Furthermore, "early fire detection" in the present description refers to the detection of a fire while still in its incipient phase whereby early fire detection of course also includes detecting fires which have already developed. It is, however, the objective of early fire detection to detect a developing fire in the so-called pyrolytic phase during which the material being heated, e.g. cable coilings, are already emitting smoke aerosols. The term "fire parameter" refers to physical variables which undergo measurable changes in the vicinity of an incipient fire such as e.g. the ambient temperature, the ratio of solids or liquids or gases in the ambient air (accumulation of smoke as particles or aerosols or vapors), or the ambient radiation.

Service and production enterprises are relying to a continually greater degree on the operability and the high availability of their computer installations. Therefore, large computing centers or electrical power plants place correspondingly high importance on fire prevention. Yet there are often only just a few or even singly-positioned network or control racks to ensure most of the working operations. Hence, various different departments of a company will make use of centrally-operated network racks or individual control racks. Regardless of their great importance, these equipment racks are frequently situated in areas unmonitored by fire alarm systems. These technical installations therefore often represent an underestimated risk because a fire not detected promptly can quickly lead to substantial disruptions in operations or production. In order to reduce possible damage from fire to the electronic "inner workings" of such equipment racks to its absolute minimum or even circumvent it altogether, very high requirements are placed on fire prevention and should include earliest detection, disconnecting the power supply, and fast as well as residueless extinguishing of the incipient fire.

2. Description of the Prior Art

An apparatus of the type cited above is known for example from DE 10 2004 048 233. The known prior art system comprises an apparatus for early fire detection which consists essentially of a fan unit and a detector for detecting a fire parameter using an air sample extracted with the fan unit. Specifically, it is provided to arrange the early fire detection apparatus above the housing of the equipment rack to be monitored, whereby the fan unit can draw the representative air sample out of the cooling air flow for the equipment rack.

Problematic to such a solution however is, on the one hand, the relatively large overall height of the fire detection system. On the other hand, for various reasons, it is often not possible or only possible with great effort to arrange the fire detection system on the housing cover for the equipment rack to be monitored. There is in fact often not enough installation space available above equipment rack housing covers to install such a system. This has the consequence that retrofitting an equipment rack with a fire detection system can only be done at great constructional effort and sometimes may not even be possible at all. Furthermore, a fire detection system installed on a housing cover often cannot ensure a sufficient dissipation of heat for the electronic or electrical components integrated in the equipment rack such that the operability of the components in the equipment rack is affected. The known fire detection system is also only suited to a limited extent to simultaneously monitoring a plurality of separate electrical equipment racks.

SUMMARY OF THE INVENTION

Given this background to the problem posed, the task which the present invention addresses is that of providing an apparatus for detecting fire in electrical equipment racks of the type described at the outset in which optimum protection is afforded the electrical equipment rack to be monitored independently of the spatial dimensions to said equipment rack and the space available between the housing cover for the equipment rack and the room's ceiling. In particular, the solution according to the invention is to be as flexible and economical in application as possible, whereby retrofitting an electrical equipment rack with a fire detection system is feasible without constructional measures and yet as economically as possible.

These tasks are solved in accordance with the invention by an apparatus as specified at the outset for detecting fire in electrical equipment racks in that the early fire detection module is configured as a rackmount to be inserted into the electrical equipment rack to be monitored.

The solution according to the invention exhibits substantial advantages over the known and above-specified fire detection system. On the one hand, a separate suction pipe system is provided which can be integrated in space-saving manner into the electrical equipment rack to be monitored and which communicates with, i.e., is fluidically connected to the equipment rack to be monitored through at least one suction opening advantageously disposed in the ceiling region of the equipment rack. Representative air samples are taken from the equipment rack through this suction pipe system and fed to the early fire detection module or the at least one detector unit provided in the early fire detection module. By configuring the early fire detection module according to the invention as a rackmount which can be inserted into the electrical equipment rack to be monitored, the inventive solution does away with the need for externally mounting the fire detection system to the electrical equipment rack to be monitored. The early fire detection system according to the present invention can thus be inserted into the electrical equipment rack to be monitored fully independently of the space available in the proximity of said equipment rack. This in particular also enables an electrical equipment rack to be particularly economically and simply retrofitted with an early fire detection system.

A further advantage can be seen in that the essential components of the electrical equipment rack-fire detection apparatus according to the invention, and in particular the at least one detector unit, can be configured as modular components. Considered "modular" in the sense of the present invention are in particular functional components which can be added or removed as needed to the early fire detection module configured as a rackmount based on the "modular design principle" without requiring extensive restructuring to the layout of the fire detection apparatus. It is thus obvious that the modular design to the inventive fire detection apparatus particularly facilitates customized solutions.

Advantageous further developments of the apparatus according to the invention for fire detection in an electrical equipment rack are indicated in the subclaims.

One preferred realization of the solution according to the invention provides for the rackmount to be a standard rack having an overall height of 1 U. As also generally under-stood in the field of event, laboratory and shelving technology, the term "rack" or "rack-mount" refers to a storage rack in particular for electrical devices having a standardized width of 19 inches, with which the individual devices mountable into the rack have a front panel width of just over 48 cm. A height unit (U) is specified as 1.75 inch (4.45 cm). A standard rack is a standardized 19-inch rack according to the EIA 310-D, IEC 60297 and the German Institute for Standardization's DIN 41494 SC48D, whereby any given number of devices can be mounted as long as they also correspond to this specified standard. Standard racks for servers in computing centers of a height of 2 meters usually offer a net area of 42 U, whereby there are also rack types in which the overall depth varies just as there are versions with additional room on the sides to accommodate cables.

By virtue of the fact that the apparatus according to the invention makes use of an aspirative early fire detection module, it is possible to minimize the overall size and in particular the overall height of the apparatus, whereby the early fire detection apparatus can be advantageously integrated into a 19" rack-mount at an overall height of only 4.45 centimeters (=1 U), which in particular allows the apparatus to be used in electrical equipment racks without severely limiting the mounting space available in the equipment rack for accommodating electrical devices.

One preferred further development of the solution according to the invention further provides for the rackmount to exhibit a plug connection, by means of which the detector unit configured as a modular component self-connects with the suction pipe system when the rackmount is inserted into the electrical equipment rack. This thus yields a particularly simple to operate and modularly-configured solution which enables replacing or retrofitting a conventional electrical equipment rack with such an electrical equipment rack-fire detection system. Different solutions are applicable in technically realizing the plug connection.

A particularly preferred embodiment provides for the suction pipe system to connect a plurality of electrical equipment racks to be monitored, whereby the suction pipe system communicates with the individual monitored electrical equipment racks by means of at least one respective suction opening, and whereby the suction pipe system is used to extract a representative air sample from each respective electrical equipment rack monitored which is then fed to the early fire detection module. According to this embodiment, a plurality of electrical equipment racks can hence be monitored by one single early fire detection module configured as a rackmount. All that would be necessary in this regard is extending the suction pipe system, i.e., laying same into the additional electrical equipment racks to be monitored and providing the corresponding suction openings. It is of course also conceivable to provide for a plurality of separate independently-acting suction pipe systems, whereby each individual suction pipe system connects one electrical equipment rack or a group of electrical equipment racks to the early fire detection module. The particular advantage to this embodiment is that the inventive solution also allows for a plurality of electrical equipment racks to be equipped or (subsequently) retrofitted with an early fire detection system in a particularly simple manner, wherein this is done particularly economically and in particular without requiring constructional measures.

In order to ensure that the respective air samples can be independently drawn out of the electrical equipment rack(s) to be monitored through the suction pipe system with the fire detection apparatus according to the invention, a particularly preferred further development provides for the early fire detection module to further comprise a fan module configured as a modular component and controllable by the controller. The modular design to the fan module, which can be integrated as a separate component in the early fire detection module configured as a rackmount (as needed), continues the simple and modular design of the inventive apparatus. It is of course also conceivable for the inventive apparatus to extract the air samples from the cooling air flow for the monitored electrical equipment rack so that a separate fan module may also be dispensed with as need be.

In a particularly preferred further development of the latter embodiment in which a fan module configured as a modular component and controllable by the controller is provided for aspirating the air samples from the monitored electrical equipment rack(s) through the suction pipe system, the early fire detection module further comprises an exhaust module configured as a separate component and controllable by the controller for blowing out the air sample drawn into the suction pipe system, whereby the exhaust module is actuated by the controller when the at least one detector unit detects at least one fire parameter in the extracted air samples. By providing an indicator element to identify the location of a fire in one of the monitored equipment racks and/or a communication means provided to transmit information regarding the development and/or presence of a fire in one or more of the monitored equipment racks as well as the specific localization of the fire in the one or plurality of monitored equipment racks to a location remote of the apparatus, the equipment rack respectively, the solution according to the invention is also particularly suited to the exact localizing of a fire when a plurality of electrical equipment racks are being monitored by the inventive apparatus. It would also be conceivable in this case for the respective representative air sample to be extracted through the suction pipe system—preferably continuously—from the equipment rack air of each individually-monitored electrical equipment rack. As soon as the at least one detector unit detects a fire parameter in the air sample extracted through the suction pipe system, the exhaust module blows out the air previously suctioned in and located within the suction pipe system. Representative air samples are subsequently extracted anew through the suction pipe system from the equipment rack air of each individual monitored electrical equipment rack for at least as long as necessary until the at least one detector unit again detects a fire parameter in the air sample. In so doing, the time it takes until the fire parameter is detected anew in the newly-withdrawn air sample extraction is an indicator for localizing the site of the fire or the site of a developing fire in one of the plurality of monitored electrical equipment racks. The indicator element can emit a signal which indicates the development and/or the presence of a fire in one or more of the monitored electrical equipment racks. This signal furthermore contains information as to the exact localization of the fire in the one or more electrical equipment racks monitored.

This preferred further development, which thus technically enables a fire to be localized in one of the plurality of monitored electrical equipment racks, allows a particularly simple and economical retrofitting for individually detecting the origin of fires or gaseous contaminants under the criteria of existing standards. The particular advantage to this embodiment is that it not only meets the requirements for a simple retrofitting of an equipment rack at concurrently low operating costs by means of a particularly simple to realize and thereby very effective procedure for detecting and localizing a fire and/or a developing fire in one of a plurality of electrical equipment racks to be monitored but because the advantageous embodiment of the inventive apparatus also localizes the site of a fire, new applications are created for electrical equipment rack-fire monitoring units. In particular, there is hence now no need for a plurality of individual fire alarms as otherwise used in individual electrical equipment racks when monitoring a plurality of such electrical equipment racks.

By virtue of the fact that the fire detection and fire localization is based on an aspirative operating principle, this feature to the inventive electrical equipment rack-fire detection apparatus is extremely sensitive and in particular independent of, for example, turbulence in the air caused by the fans used for cooling purposes in the individual equipment racks. Blowing out the air samples extracted and present in the suction pipe system after the at least one detector unit detects at least one fire parameter in the air sample sucked through the suction pipe system results in fresh air then being present throughout the entire suction pipe system, meaning air which definitely no longer exhibits any fire parameters. After the air being blown out, new representative air samples from the electrical equipment rack air of the individually monitored electrical equipment racks are respectively drawn anew from the individual electrical equipment racks through the suction pipe system.

An essential aspect of this further development is that the controller is designed so as to measure the time lapse, or is respectively based on defined time values, until the detector again detects a fire parameter in the air samples suctioned through the jointly-shared suction pipe system. This time lapse is subsequently analyzed by the controller in order to localize the site of the fire or the site of a developing fire, based on the fact that each individual monitored electrical equipment rack is located at a specific distance from the at least one detector unit and also exhibits a time lapse dependent on the suction pipe system.

One particular advantageous realization of the latter embodiment in which the electrical equipment rack-fire detection apparatus according to the invention is thus afforded the operational feature of localizing the site of a fire provides for the controller to be designed to temporally coordinate the fan module and the exhaust module in correlation with a signal emitted by the detector unit. This therefore also enables having all control sequences be realized in the inventive apparatus. In particular, this concerns an independent and autarkic system in which reliable fire detection and localization is enabled with a substantially rackmount-configured system.

It would also be conceivable here for the controller to selectively disconnect an electrical equipment rack and/or emit a signal to flood the equipment rack with extinguishing agent when a fire is localized in that particular electrical equipment rack. In general, it is preferable to configure the early fire detection module so that the controller will emit an early fire detection signal in response to a detection result returned by the at least one detector unit which will shut off the power supply to the monitored electrical equipment rack(s).

A further advantageous realization of the apparatus according to the invention designed to localize the site of a fire provides for the fan module and the exhaust module to be configured jointly as one blower which changes its air flow direction in response to a control signal from the controller. This thereby achieves a further reduction in the number of essential components making up the inventive apparatus, which in turns advantageously lowers the costs involved in manufacturing the inventive apparatus.

To further reduce the number of components comprising the inventive fire detection and localization apparatus, the fan module configured as a blower is advantageously configured as a fan with reversal of rotation.

A further realization of the latter-cited apparatus according to the invention in which the fan module and the exhaust module are configured jointly as a blower provides for the blower to be a fan having ventilation flaps for changing the air flow direction. Of course, other embodiments are just as conceivable here.

As described above, the apparatus according to the invention comprises indicator elements by means of which the site of a detected fire in one of the monitored electrical equipment racks can be identified. These indicator elements, for example a visual display or an acoustic signal, can be disposed on the face plate of the electrical equipment rack. Additionally to or in place of the indicator elements, the apparatus can further comprise communication means to transmit information as regards the onset and/or the presence of a fire in one or more of the monitored equipment racks as well as the specific localization of the fire in the one or plurality of monitored equipment racks to a location remote of the device such as a central fire alarm system or a firefighter control station. Depending on application, the communication means thereby advantageously allows either a wired and/or a wireless communication possibility for issuing a corresponding signal as needed to at least one associated receiver disposed at a location remote from the inventive apparatus. Such a communication means can itself, of course, also be externally controlled, for example in order to change or test the operational status of the apparatus. IR technology would also be applicable as a conceivable communication medium.

It does, however, need to be emphasized here that the providing of such communication means is not limited to the embodiments of the inventive electrical equipment-fire detection apparatus in which the fire localization is based on the optional (additional) feature of time lapse measurement of the extracted air samples. Rather, the conceivable equipping of an early fire detection module with such communication means, which can be realized for example with an interface between the controller and a central control for the computing center, is in principle understood to be a basic fundamental in order to forward alarms, first pre-alarms, temperature alarms (when the inventive electrical equipment-fire detection apparatus is provided with temperature sensors) or notifications of malfunction as needed. Conceivable in this regard would be realizing an Ethernet signal transmission with a TCP/IP or SNMP data protocol. Other solutions are, of course, also conceivable here.

A particularly preferred embodiment of the electrical equipment rack-fire detection apparatus according to the invention provides for the air flow of the air sample extracted through the suction pipe system to be monitored by an air flow monitoring module controllable by the controller and configured as a modular component. This air flow monitoring module can likewise be provided in the early fire detection module of the inventive apparatus. Conceivable for example here would be for the air flow monitoring module to determine—for example, continuously—the flow speed to the air samples in the suction pipe system. When the determined flow speed falls outside of a definable range, i.e. deviates too greatly from predefined default values, the controller of the early fire detection module issues the corresponding alarm (malfunction). This development achieves particularly high reliability and accuracy for the fire detection apparatus.

In order to also have the fire detection apparatus according to the invention be applicable as an apparatus for extinguishing fire in electrical equipment racks, a preferred further development of the invention additionally provides for an extinguishing gas mechanism controllable by the controller to introduce extinguishing gas into the monitored electrical equipment rack(s) after a fire parameter has been detected, whereby the extinguishing gas mechanism is integrated in the early fire detection module as a modular component or configured as a separate rackmount. The advantages to this embodiment are obvious: this solution not only provides optimum monitoring but also an additional optimum protection of the electrical equipment racks to be monitored, and does so independently of the spatial dimensions to the equipment rack and the space available between the rack's housing cover and the ceiling. In particular, the solution according to the invention in which in addition to fire detection, fire extinguishing is also provided for the electrical equipment racks, is extremely flexible and economical, whereby an electrical equipment rack can be subsequently retrofitted with such a fire detection and control system without constructional measures and, above all, economically.

A preferred realization of the latter embodiment in which the inventive apparatus has an extinguishing gas mechanism controllable by the controller provides for the extinguishing gas mechanism to be arranged in the base of the electrical equipment rack to be monitored or at least in one base of the electrical equipment racks to be monitored respectively, preferably in the form of extinguishant cylinders. This solution is particularly space-saving.

The term "extinguishing gas" is to be understood in the present context as both chemical extinguishing gases such as, for example, FM 200 or Novec 1230, as well as all inert gases where the extinguishing effect is known to be based on reducing the oxygen content in the air at the location of a fire. While ambient air normally consists of approx. 48% nitrogen, 20% oxygen, ~1% argon and 0.03% carbon dioxide, this composition in the event of a fire—or to minimize the risk of a fire developing—is subject to continual change by addition of an extinguishing gas such that the oxygen content drops to a value below 15% by volume. Depending on application, nitrogen, argon and carbon dioxide are primarily used as inert gas extinguishing agents. While argon is preferably used only to flood partial areas due to its relatively high density compared to nitrogen and drier ambient air (e.g. in raised floors), carbon dioxide takes on a special significance as a traditional extinguishing agent for non-enclosed facilities. Because of its toxicity, caution is required when using carbon dioxide in closed spaces. The main field of application for nitrogen is in flooding entire rooms as well as flooding enclosed facilities. Therefore, nitrogen is the optimum extinguishing agent in the majority of cases.

A particularly preferred realization of the apparatus according to the invention which exhibits a fire controlling function in addition to fire detection provides for the extinguishing gas mechanism to have an extinguishing gas generator which produces a gaseous extinguishing agent by chemical reaction in the event of a fire, in particular by a predefined oxidation of combustible materials. This inventive further development does away with the need to store the extinguishing agent in a high-pressure gas cylinder as it is instead not produced until an actual fire. This in particular considerably reduces the spatial dimension to the extinguishing gas mechanism such that the extinguishing gas mechanism can itself be readily integrated as a modular component in the early fire detection module or configured as a separate rackmount, whereby in the latter case, the rackmount of the extinguishing gas mechanism is of but small overall height.

Alternatively or additionally to the latter preferred realization, the extinguishing gas mechanism can also comprise an aerosol generator configured so as to produce extinguishing gases, in particular nitrogen, water and potassium compounds, by means of chemical reaction triggered in the event of a fire.

The two advantageous realizations of the extinguishing gas mechanism allow for the quick and efficient extinguishing of a fire which has broken out in a monitored electrical equipment rack and detected by means of the at least one detector unit. Firefighting procedures which are based on an extinguishing gas generator or on an aerosol generator are in particular extremely environmentally friendly. The reaction process in the extinguishing process, preferably based on potassium compounds or inert gases, in essence guarantees fire control without the usual consequential damage associated with water or foam. Particularly when fighting fires in electrical equipment racks accommodating electrical and/or electronic components, such consequential damage has the potential to be devastating. In addition, water-based or foam-based firefighting frequently leads to polluting of the environment.

As mentioned above, the overall height of the inventive apparatus can be reduced in particular by using an extinguishing gas or aerosol generator as the extinguishing gas mechanism, which additionally embodies a fire controlling functionality.

In general, it is preferred to configure the early fire detection module such that in response to a detection result issued by the at least one detector unit, an early fire detection signal is emitted by the controller, by means of which the power supply to the monitored electrical equipment rack(s) is first switched off and by means of which the extinguishing gas mechanism is subsequently or simultaneously activated.

In order to have as error-free and accurate functioning as possible for the previously-cited advantageous further developments of the electrical equipment rack apparatus according to the invention in which apart from the functionality of fire detection, also the functionality of controlling fire is provided, and thus enable reliable fire detection and fire control, a temperature-controlled ignition device is preferably provided to trigger the extinguishing gas mechanism upon a definable temperature being exceeded. This type of ignition device could, for example, consist of different temperature sensors which emit a corresponding signal in the event of a fire either to the controller provided in the early fire detection module or to the extinguishing gas mechanism itself in order to activate said extinguishing gas mechanism. On the other hand, it would also be conceivable for the extinguishing gas mechanism to be equipped with a bipolar plug connection for an electrical start and a temperature-controlled fuse (thermocord) for self-activation. This temperature-controlled fuse is activated as soon as the predefined temperature is reached. Due to the special design, the extinguishing agent automatically disperses onto the equipment to be extinguished after the extinguishing procedure having been triggered.

To have the dispersal of extinguishing agent produced by the extinguishing gas mechanism be as optimum as possible in the individual monitored electrical equipment racks in the event of a fire and in order to attain a selective introduction of extinguishing agent into a specific equipment rack or group of specific equipment racks (as circumstances dictate), an advantageous embodiment of the apparatus according to the invention configured for fire control in addition to fire detection further comprises an extinguishing gas supply line system which connects the extinguishing gas mechanism with the monitored electrical equipment racks and through which the extinguishing gas produced by the extinguishing gas mechanism can be fed to the individual electrical equipment racks in the event of a fire. It is of course also conceivable for each individual monitored electrical equipment rack to be connected to a separate extinguishing gas supply line system in order to enable a selective supply of extinguishing agent to individual electrical equipment racks.

With respect to the system reliability of the solution according to the invention, it is finally provided for the apparatus to have a plurality of early fire detection modules working in parallel, each comprising a detector unit and a preferably jointly-shared controller, respectively an early fire detection module having a controller and a plurality of detector units working in parallel, whereby said controller is configured such that depending on the respective detection result returned by the detector units, an early fire detection signal is emitted to shut off the power supply to the monitored electrical equipment rack(s) and/or actuate an extinguishing gas mechanism in order to introduce extinguishing gas into the monitored electrical equipment rack(s). It would be particularly conceivable here to configure the controller so as to emit an early fire detection signal when any respective detector unit returns a detection result indicating a fire.

The apparatus according to the invention is particularly characterized by its modular structure. An advantageous further development of the inventive electrical equipment rack-fire detection and/or electrical equipment rack-fire control apparatus provides for the early fire detection module to exhibit a plurality of receiving elements for receiving the module configured as a separate component and provided in the early fire detection module, whereby this module provided in the early fire detection module and configured as a separate component is configured in particular as a plug-in module which can be inserted into the receiving elements. This enables the construction of the apparatus according to the invention to be based on the modular design principle which, on the one hand, lowers the costs involved in manufacturing the inventive apparatus and, on the other, enables an effective and easily-realized user-specific solution.

The following will make reference to the figures in describing preferred embodiments of the inventive apparatus in greater detail.

BRIEF DESCRIPTION OF THE DRAWINGS

Shown are.

DETAILED DESCRIPTION OF AN ILLUSTRATIVE EMBODIMENT

Figure 1:
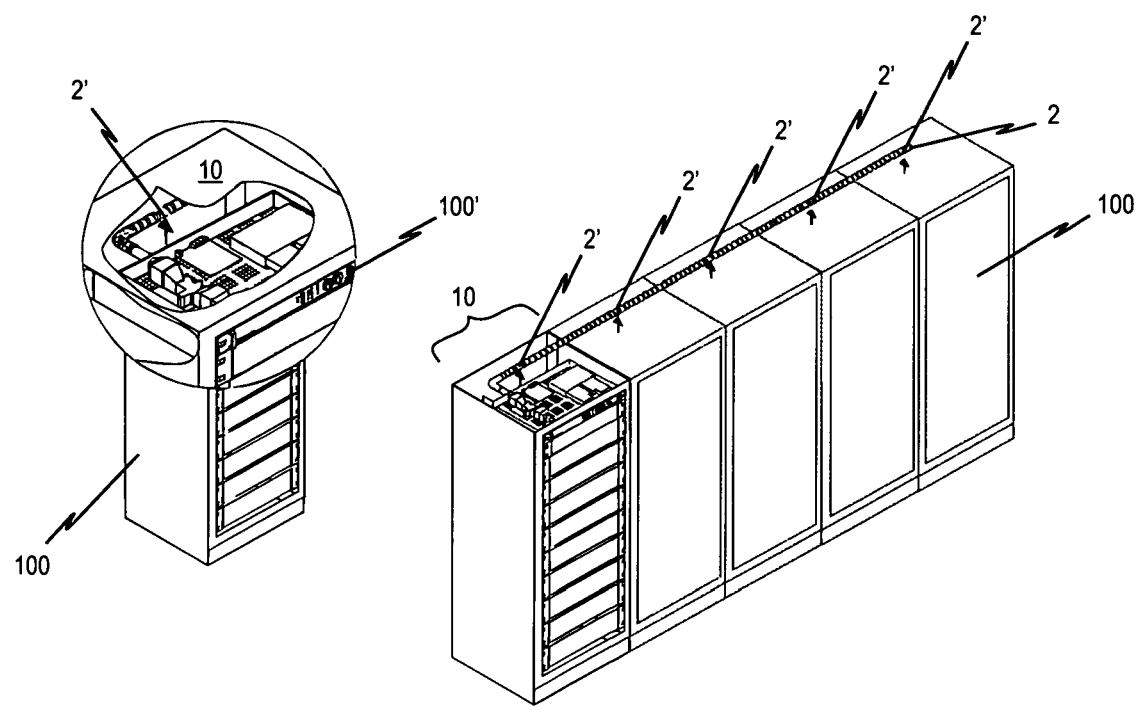
FIG. 1 a schematic view of a first preferred embodiment of the apparatus according to the invention in the installed state, whereby the apparatus is configured as an electrical equipment rack-fire detection apparatus.

FIG. 1 shows a schematic view of a first preferred embodiment of the apparatus according to the invention in the installed state, whereby the apparatus is configured as an electrical equipment rack-fire detection apparatus. The electrical equipment rack-fire detection apparatus exhibits a suction pipe system 2 which connects a plurality of adjacently arranged electrical equipment racks 100 (in the embodiment as shown, a total of five electrical equipment racks 100), whereby the suction pipe system 2 communicates with the individual electrical equipment racks 100 to be monitored through respective suction openings 2'. The fire detection apparatus according to this embodiment moreover exhibits an early fire detection module 10 comprising a detector unit 11 (to be described below) for identifying at least one fire parameter in the air sample drawn through the suction pipe system 2 and a controller 12 for emitting an early fire detection signal in response to a detection result returned by the detector unit 11. Representative air samples are respectively extracted from the individual monitored electrical equipment racks 100 by means of the suction pipe system 2 and fed to the early fire detection module 10 configured to be inserted as a rackmount 100' in one of the electrical equipment racks 100 to be monitored.

Figure 2:
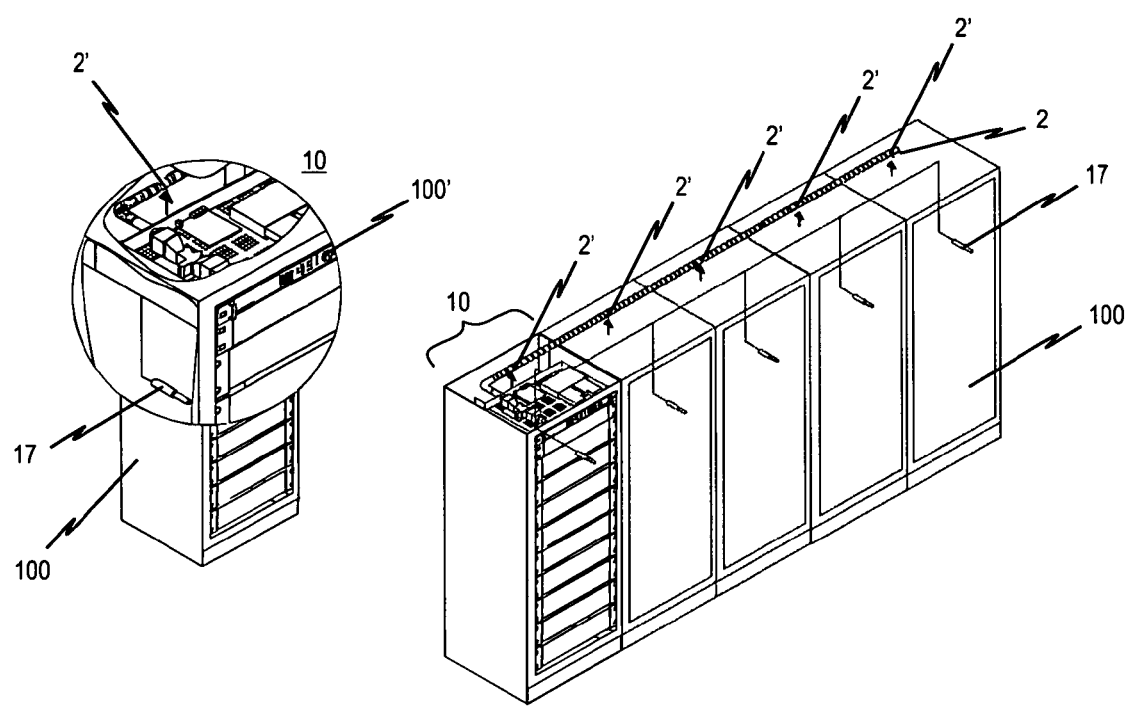
FIG. 2 a schematic view of a second preferred embodiment of the apparatus according to the invention in the installed state, whereby the apparatus is configured as an electrical equipment rack-fire detection apparatus having the additional functionality of temperature detection, temperature sensing respectively.

FIG. 2 shows a schematic view of a second preferred embodiment of the apparatus according to the invention in the installed state, whereby the apparatus is configured as an electrical equipment rack-fire detection apparatus having the additional functionality of temperature detection, temperature monitoring respectively. This embodiment differs from the embodiment shown in FIG. 1 by the integration of temperature sensors 17 in order to improve fire detection capability in the individual electrical equipment racks 100. The temperature sensors 17 feed to the early fire detection module 10, respectively the controller 12 provided in the early fire detection module 10 over a shared line. Of course, it is also conceivable—differing from the embodiment depicted in FIG. 2—to not have each individual equipment rack 100 be equipped with a temperature sensor 17.

Figure 3:
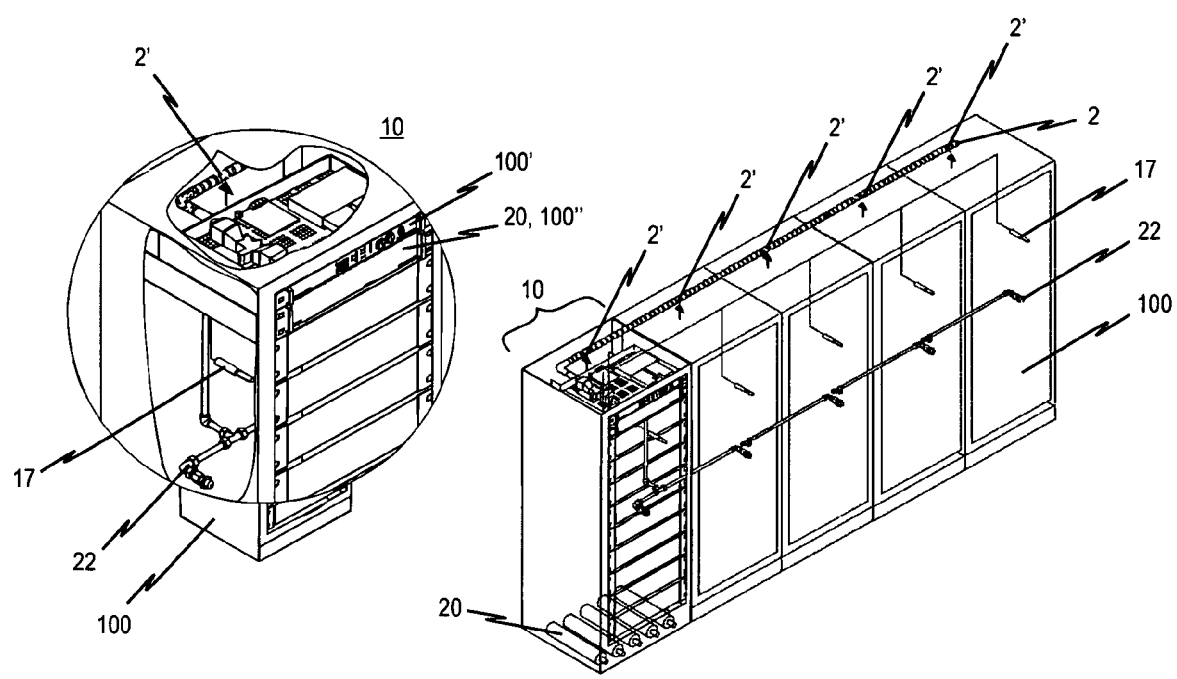
FIG. 3 a schematic view of a third preferred embodiment of the apparatus according to the invention in the installed state, whereby the apparatus is configured as an electrical equipment rack-fire detection apparatus having the additional functionalities of temperature detection and fire control.

FIG. 3 shows a schematic view of a third preferred embodiment of the apparatus according to the invention in the installed state, whereby the apparatus is configured as an electrical equipment rack-fire detection apparatus having the additional functionalities of temperature detection and fire control. This embodiment differs from the second preferred embodiment shown in FIG. 2 in that in addition to the fire detection function, the electrical equipment rack-fire detection apparatus additionally exhibits a fire controlling function. To this end, a (not explicitly shown) extinguishing gas mechanism 20 in the form of an additional rackmount 100" is inserted in one of the electrical equipment racks 100 to be monitored underneath the rackmount 100' likewise configured as an early fire detection module 10. An extinguishing gas feed line system 22 is moreover provided which extends between the extinguishing gas mechanism 20 configured as rackmount 100" and the individual electrical equipment racks 100 to be monitored. In the event of a fire, an extinguishing agent produced in the extinguishing gas mechanism 20 is fed to the individual electrical equipment racks 100 through this extinguishing gas feed line system 22. Optionally conceivable is not configuring the extinguishing gas mechanism 20 as a separate rackmount 100" (as depicted), but rather integrating it into the early fire detection module 10 as a modular component.

The electrical equipment rack-fire detection apparatus according to FIG. 3, in which apart from the fire detection functionality also exhibits the functionality of controlling fire, is—as previously indicated—equipped with the extinguishing gas mechanism 20 which is integrated as a modular component in the early fire detection module 10 or in the associated rackmount 100' of the early fire detection module 10 or configured as a separate rackmount. It is thereby preferable for the extinguishing gas mechanism 20 to comprise an extinguishing gas generator (not explicitly shown) which produces a gaseous extinguishing agent by chemical reaction in the event of a fire. In other words, this means that there is no need to store extinguishing agents in the inventive apparatus according to FIG. 3 as in high-pressure gas cylinders, which serves to reduce the overall size and dimensions of the electrical equipment rack-fire detection apparatus as a whole. It would be conceivable here that in the event of a fire, a chemical reaction is triggered in extinguishing gas mechanism 20 to produce nitrogen, water and potassium compounds. The combustion process is thereby stopped by the catalytically-triggered reaction. Alternatively or additionally hereto, it is also conceivable to use nitrogen-rich organic combustibles in combination with selected oxidizers and catalysts as propellants for extinguishing gas mechanism 20. Upon a fire being detected, these compressed combustibles, for example in the form of tablets, are then ignited in one of the monitored electrical equipment racks 100 to produce a gaseous extinguishing agent within a short period of time which is fed through the extinguishing gas supply line system 22 to electrical equipment rack 100.

Although not depicted in the figures, one particularly preferred further development provides for mechanisms for self-activating the extinguishing gas mechanism 20 so that an extinguishing process can be triggered immediately upon a fire starting. Conceivable here would be, for example, for the extinguishing gas mechanism 20 to activate itself upon heat generation and quickly and efficiently extinguish a fire which has broken out. A heat-based activation of the extinguishing gas mechanism 20 can moreover be triggered by, for example, temperature sensors 17.

The particular advantage to the optional extinguishing gas mechanism 20 in the inventive apparatus according to FIG. 3 which uses aerosol generators or extinguishing gas generators is in its high storage stability and longevity, since there are no pressurized containers for storing extinguishing agents, and the particularly autonomous and automatic functioning. Furthermore, since there is no pressure supply or external power supply, additional maintenance of the system becomes unnecessary.

Apart from the previously mentioned heat-based self-activation of extinguishing gas mechanism 20, it is also conceivable for same to be equipped with a temperature-controlled fuse (thermocord) for self-activation. This temperature-controlled fuse is thereby to be configured such that the extinguishing gas mechanism 20 is activated as soon as a pre-definable temperature is reached. After the extinguishing process has been triggered, the extinguishing agent produced in the extinguishing gas mechanism 20 disperses through the extinguishing gas supply line system 22 to the equipment to be extinguished. Of course, other procedures for triggering the extinguishing gas mechanism 20 are also conceivable. In particular, aerosol generators in which the extinguishing agent is produced by means of chemical reaction, can be triggered electrically, thermally or even manually. After the system has been activated, the potassium compound is catalytically converted and disperses through the extinguishing gas supply line system 22 onto the fire which has broken out in an electrical equipment rack 100 or in a group of electrical equipment racks 100 and been detected by the early fire detection module 10. Aerosol generators are particularly characterized by their effectiveness and efficiency. For example, 1 gram of solid potassium compound substance yields a volume of 1000 ml aerosol.

In a case where inert gas pressure tanks or extinguishing agent containers are used as the extinguishing gas mechanism 20, for example, it would be conceivable for the extinguishing gas mechanism 20 to also be arranged in the base of the electrical equipment rack 100 to be monitored or at least in one base of the electrical equipment racks 100 to be monitored, as indicated in FIG. 3. It would, of course, also be conceivable that in a case of the extinguishing gas mechanism 20 exhibiting an aerosol generator, same is accommodated in the equipment rack base, which represents a particularly space-saving solution.

Figure 4A:
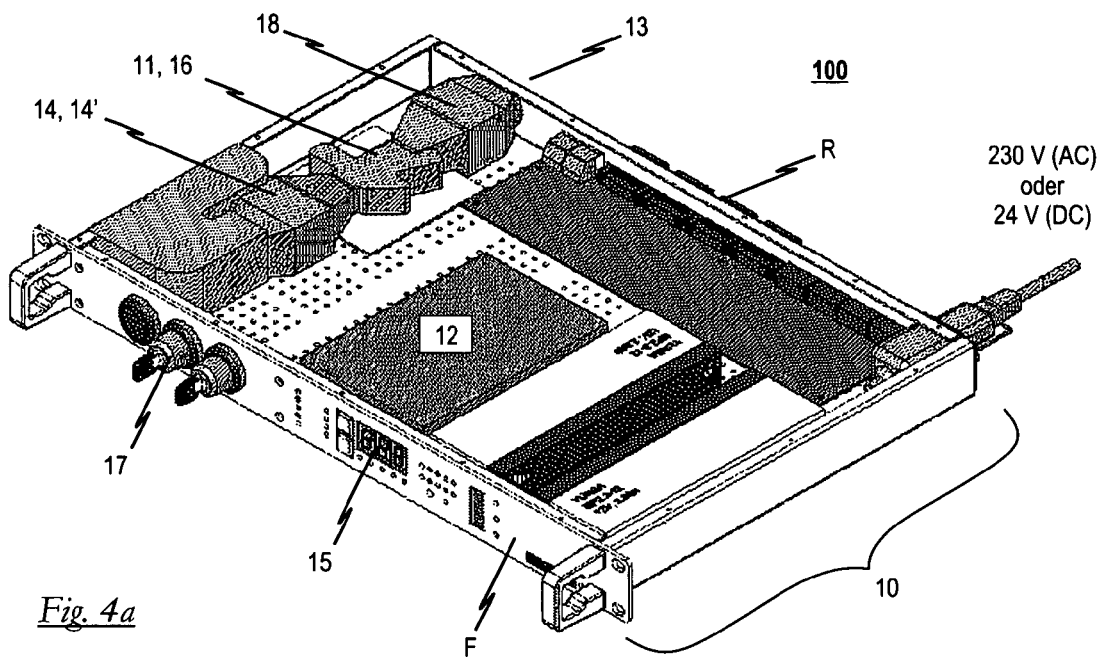
FIG. 4a a perspective partially sectional view of a rackmount in which a preferred embodiment of the early fire detection module is integrated.
Figure 5:
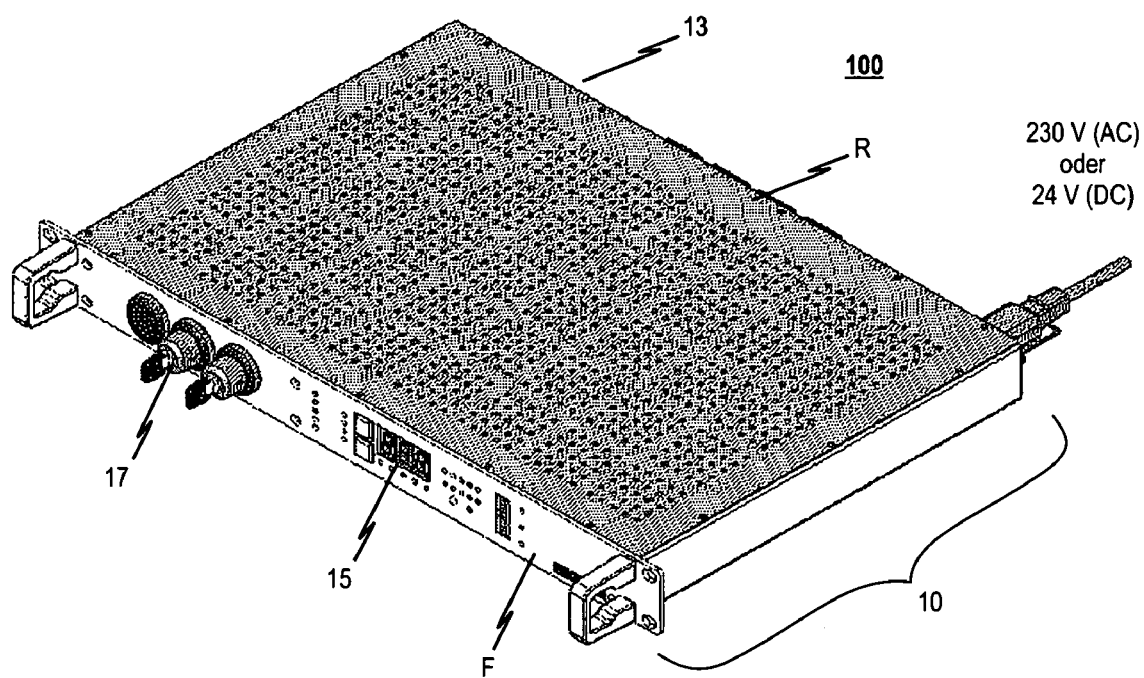
FIG. 5 a perspective view of the rackmount according to FIG. 4a in the closed state.

FIG. 4a shows a perspective partially sectional view of a rackmount 100' in which a preferred embodiment of the early fire detection module 10 is integrated. FIG. 5 on the other hand shows a perspective view of the rackmount 100' according to FIG. 4a in a closed state.

As depicted in FIG. 4a, all the components in the rackmount 100' are of modular configuration and arrangement to one another. Specifically, rackmount 100' exhibits a plug connection 13 at its rear side R, by means of which the early fire detection module 10 is connected with the suction pipe system 2 (not explicitly shown in FIG. 4a) when—as shown in FIGS. 1 to 3—the rackmount 100' is inserted into the electrical equipment rack 100. The air samples drawn through the suction pipe system 2 are then fed to the early fire detection module 10 via plug connection 13.

Specifically, the early fire detection module 10 in the embodiment depicted in FIG. 4a exhibits the following succession of components from the plug connection 13: a filter unit 18, a fan/exhaust module 14, 14', an air flow monitoring module 16 as well as a detector unit 11. A controller 12 is furthermore provided which controls the fan/exhaust module 14, 14' and receives signals from the air flow monitoring module 16 as well as detector unit 11. The controller 12 analyzes these signals and emits the corresponding output signals to an indicator element 15 disposed on the front panel F of the rackmount 100'. Manual inputs can also be made in controller 12 through actuating means 17 which are likewise disposed on the front panel F of rackmount 100'.

In the event of fire, i.e. when detector unit 11 detects fire parameters in an extracted air sample, controller 12 sends a corresponding signal to indicator element 11 as well as an optional corresponding signal to the extinguishing gas mechanism 20 provided as needed and in FIG. 4a not explicitly shown, respectively to an ignition device connected to the extinguishing gas mechanism 20, in order to activate the production of extinguishing gas. Alternatively conceivable would be for controller 12 to emit a corresponding signal to a correspondingly controllable valve of the extinguishing gas mechanism 20 provided as circumstances dictate and not explicitly shown in FIG. 4a so that when the extinguishing gas mechanism 20 comprises pressure tanks with inert gas, the extinguishing agent can flow out of the tanks. The controller 12 is likewise fed the signals of the temperature sensors 17 (cf. FIGS. 2, 3) on which the analysis of the detection results sent to the controller 12 by the detector unit 11 is based or which can also serve as ignition means for the optionally-provided extinguishing gas mechanism as applicable.

Figure 4B:
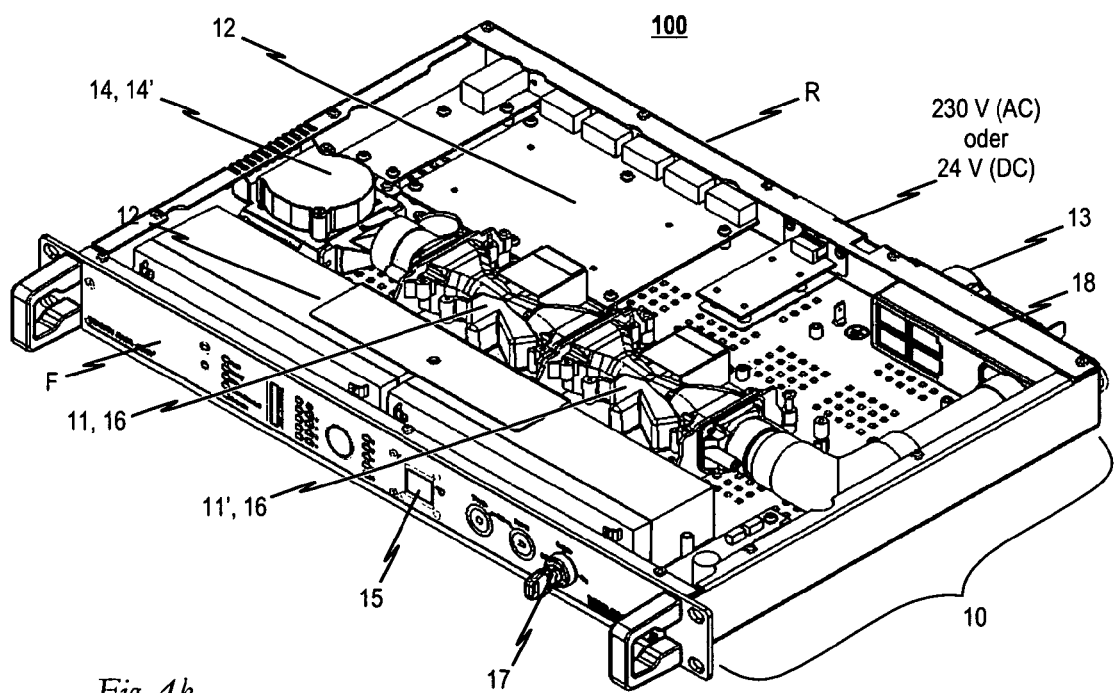
FIG. 4b a perspective partially sectional view of a rackmount in which a preferred embodiment of the early fire detection module having two detector units is integrated.

It would also be optionally conceivable here for the early fire detection module 10 of the electrical equipment rack-fire detection apparatus to exhibit a plurality of detector units 11, 11' working in parallel and a jointly-shared controller 12, as is indicated in FIG. 4b. The shared controller 12 should hereby be configured so as to emit an early fire detection signal depending on the detection result returned by the respective detector unit 11, 11' to switch off the power supply to the monitored electrical equipment rack(s) 100 and/or activate an extinguishing gas mechanism 20 in order to introduce extinguishing gas into the monitored electrical equipment rack(s) 100. This embodiment particularly ensures system reliability since the jointly-shared controller 12 is preferably configured so as to not emit an early fire detection signal until any detection result returned by the respective detector units 11, 11' indicates a fire.

As can be seen in particular in FIGS. 4a, b and 5, the very heart of the inventive electrical equipment rack-fire detection apparatus is integrated into one single rackmount 100' which can be easily inserted into the electrical equipment rack 100 to be monitored due to its low overall height of 1 U. This allows the electrical equipment rack-fire detection apparatus to be used in electrical equipment racks without severely limiting the installation space available in the electrical equipment rack for accommodating electrical devices. Of particular advantage is that fire control is also enabled in addition to fire detection by means of the optionally-provided extinguishing gas mechanism 20 which is for example integrated in the early fire detection module 10 configured as a rackmount 100' or, alternatively hereto, configured as a separate rackmount 100'.

Figure 6:
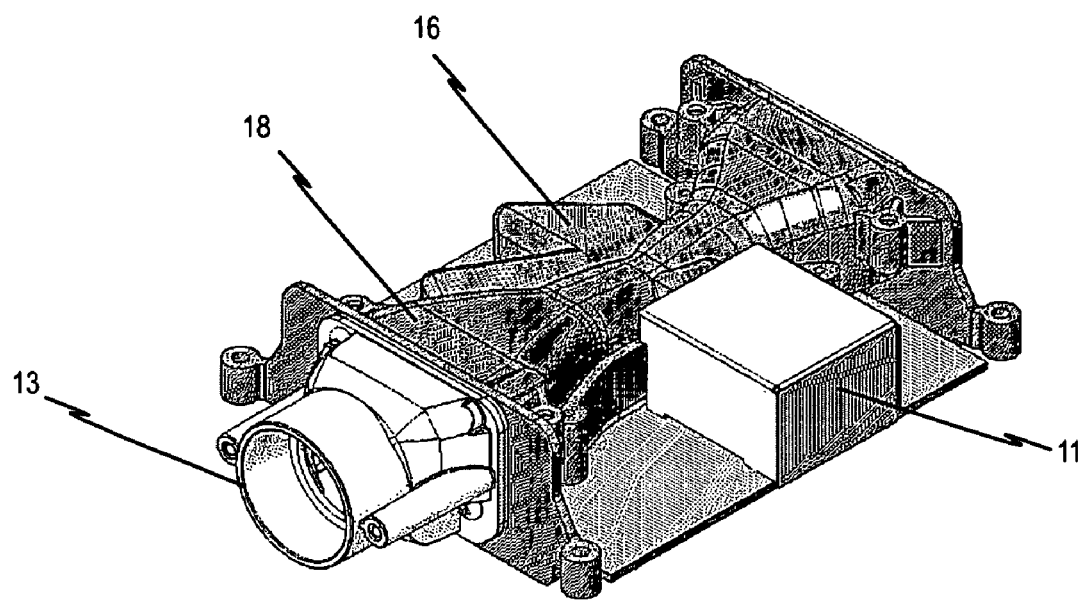
FIG. 6 a first conceivable embodiment of the early fire detection module in a separate representation.

FIG. 6 shows a separate representation of a first conceivable embodiment of the "detector unit 11," "plug connection 13," "air flow monitoring module 16" and the "filter unit 18" components of the early fire detection module 10.

Figure 7:
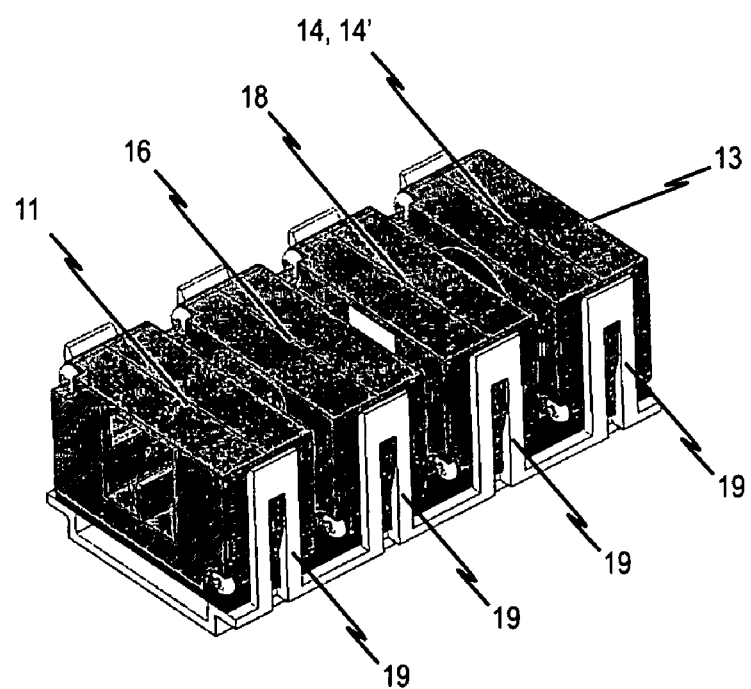
FIG. 7 an alternative second preferred embodiment to the first embodiment depicted in FIG. 6 of the early fire detection module in a separate representation.

FIG. 7 shows a separate representation of an alternative second preferred embodiment to the first embodiment shown in FIGS. 4a, b and 6 of the "detector unit 11," "fan/exhaust module 14, 14'," "air flow monitoring module 16" and the "filter unit 18" components of the early fire detector unit 10. The modular construction to the early fire detection module 10 is clearly recognizable in this embodiment. Specifically depicted in FIG. 7 is the filter unit 18, the fan/exhaust module 14, 14', the air flow monitoring module 16 and the detector unit 11. All the modules configured as modular components snap into receiving elements 19. Corresponding stop members 19' are provided for this purpose on the respective modules.

Figure 8:
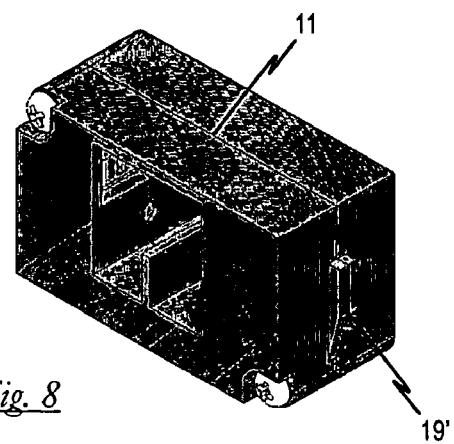
FIG. 8 a perspective view of a modularly-configured detector unit as inserted into the early fire detection module of FIG. 7 in a separate representation.
Figure 9:
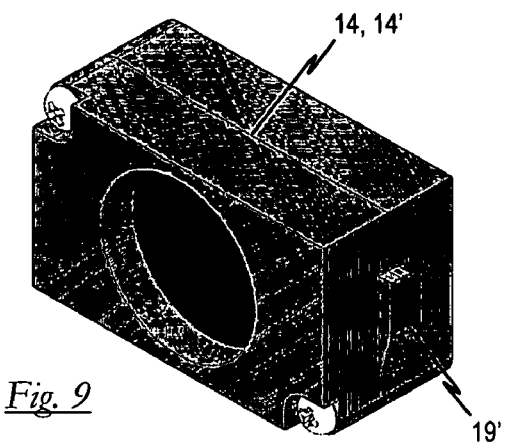
FIG. 9 a perspective view of a modularly-configured fan/exhaust module as inserted into the early fire detection module of FIG. 7 in a separate representation.
Figure 10:
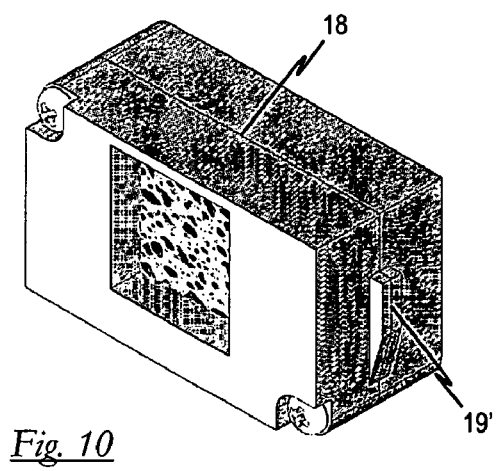
FIG. 10 a perspective view of a modularly-configured filter module as inserted into the early fire detection module of FIG. 7 in a separate representation.
Figure 11:
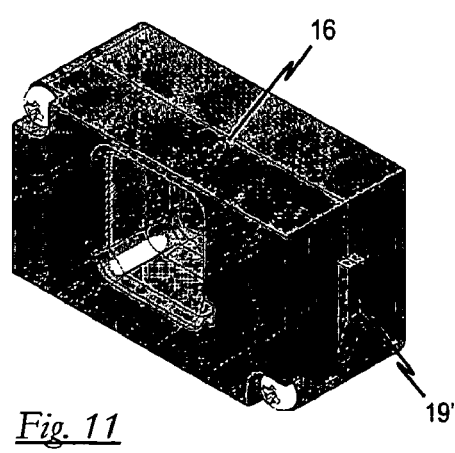
FIG. 11 a perspective view of a modularly-configured air flow monitoring module as inserted into the early fire detection module of FIG. 7 in a separate representation.

FIGS. 8 to 11 individually depict the modular components inserted into the early fire detection module 10 according to FIG. 7. Specifically, FIG. 8 shows the detector unit 11 which is configured in the form of a smoke detection chamber, for example. FIG. 9 shows the fan/exhaust module 14, 14' controlled by controller 12 in order to extract the representative air samples from the monitored electrical equipment racks 100 through the suction pipe system 2. FIG. 10 shows a filter unit 18 which can be optionally provided in the early fire detection module 10 for the protection of detector unit 11. The air flow monitoring module 16 shown in FIG. 11 can also be optionally provided in order to monitor the flawless functioning of the apparatus for fire detection and/or fire control.

It is emphasized that realizing the invention is not limited to the exemplary embodiments described by the figures, but that a plurality of variants is also possible.

The invention claimed is:

1. An apparatus for fire detection in an electrical equipment rack (100), comprising:
 a suction pipe system (2) which is provided inside the electrical equipment rack (100) to be monitored and which communicates with the electrical equipment rack (100) to be monitored through at least one suction opening (2') and through which a representative air sample is drawn from the electrical equipment rack (100) to be monitored,
 an early fire detection module (10) having at least one detector unit (11, 11') for detecting at least one fire parameter in the air sample extracted through the suction pipe system (2), and
 a controller (12) for issuing an early fire detection signal in response to the result detected with the at least one detector unit (11, 11'),
 wherein the early fire detection module (10) is configured as a rackmount (100') to be inserted into the electrical equipment rack (100) to be monitored, and
 wherein the rackmount (100') comprises a plug connection (13), by means of which the at least one detector unit (11, 11') configured as a modular component self-connects with the suction pipe system (2) when the rackmount (100') is inserted into the electrical equipment rack (100).

2. The apparatus according to claim 1, wherein the rackmount (100') is a standard rack having an overall height of 1 U.

3. The apparatus according to claim 1 or 2, wherein the suction pipe system (2) connects a plurality of electrical equipment racks (100) to be monitored, wherein the suction pipe system (2) communicates with the individual electrical equipment racks (100) to be monitored by means of at least one respective suction opening (2'), and wherein the suction pipe system (2) is used to extract representative air samples from each respective monitored electrical equipment rack (100) which are then fed to the early fire detection module (10).

4. The apparatus according to claim 1 or 2, wherein the early fire detection module (10) further comprises a fan module (14) controllable by the controller (12) and configured as a modular component for withdrawing the air samples from the monitored electrical equipment rack(s) (100) through the suction pipe system (2).

5. The apparatus according to claim 4, wherein the early fire detection module (10) further comprises an exhaust module (14') configured as a separate component and controllable by the controller (12) for blowing out the air samples drawn into the suction pipe system (2), wherein the exhaust module (14') is actuated by the controller (12) when the at least one detector unit (11, 11') detects at least one fire parameter in the extracted air samples, and wherein the early fire detection module (10) further comprises an indicator element (15) which identifies the location of a fire in one of the monitored equipment racks (100) and/or provides information by means of a communication means regarding the development and/or presence of a fire in one or more of the monitored equipment racks (100) and regarding the specific localization of the fire in the one or plurality of monitored equipment racks (100) to a location remote of the apparatus.

6. The apparatus according to claim 5, wherein the controller (12) is designed to temporally coordinate the fan module (14) and the exhaust module (14') in correlation with a signal emitted by the at least one detector unit (11, 11').

7. The apparatus according to claim 5, wherein the fan module (14) and the exhaust module (14') are configured jointly as one blower which changes its air flow direction in response to a control signal from controller (12).

8. The apparatus according to claim 7, wherein the fan module (14) configured as a blower is a fan with reversal of rotation.

9. The apparatus according to claim 7, wherein the fan module (14) configured as a blower is a fan having ventilation flaps.

10. The apparatus according to claim 1 or 2, wherein the early fire detection module (10) further comprises an air flow monitoring module (16) configured as a modular component and controllable by the controller (12) for monitoring the air flow of the air samples drawn through the suction pipe system (2).

11. The apparatus according to claim 1 or 2, wherein the early fire detection module (10) is configured such that the controller (12) will emit an early fire detection signal in response to a detected result returned by the at least one detector unit (11, 11') to shut off the power supply to the monitored electrical equipment rack(s) (100).

12. The apparatus according to claim 1 or 2, wherein the apparatus further comprises an extinguishing gas mechanism (20) controllable by the controller (12) to introduce extinguishing gas into the monitored electrical equipment rack(s) (100) after a fire parameter has been detected, wherein said extinguishing gas mechanism (20) is integrated in the early fire detection module (10) as a modular component or configured as a separate rackmount.

13. The apparatus according to claim 12, wherein the extinguishing gas mechanism (20) is disposed in the base of the electrical equipment rack (100) to be monitored, in at least one base of the electrical equipment racks (100) to be monitored respectively, wherein said extinguishing gas mechanism is extinguishant cylinders.

14. The apparatus according to claim 12, wherein the extinguishing gas mechanism (20) comprises an extinguishing gas generator which produces a gaseous extinguishing agent by chemical reaction by a predefined oxidation of combustible materials, in the event of a fire.

15. The apparatus according to claim 12, wherein the extinguishing gas mechanism (20) comprises an aerosol generator which produces extinguishing gases, wherein said extinguishing gases are at least one the group consisting of nitrogen, water and potassium compounds, by means of a chemical reaction triggered in the event of a fire.

16. The apparatus according to claim 12 further exhibiting a temperature-controlled ignition device for triggering the extinguishing gas mechanism (20) upon a definable temperature being exceeded.

17. The apparatus according to claim 12, wherein the apparatus further comprises an extinguishing gas supply line system (22) which connects the extinguishing gas mechanism (20) with the electrical equipment racks (100) to be monitored, and through which the extinguishing gas produced by extinguishing gas mechanism (20) can be fed to the individual electrical equipment racks (100) in the event of a fire.

18. The apparatus according to claim 1 or 2, wherein the early fire detection module (10) comprises a plurality of receiving elements (19) for receiving a plurality of modules (11, 12, 14, 14', 16, 20) configured as separate components and provided in the early fire detection module (10), whereby said plurality of modules (11, 12, 14, 14', 16, 20) provided in the early fire detection module (10) and configured as separate components are configured as plug-in modules which can be inserted into the receiving elements (19).

19. The apparatus according to claim 1 or 2 exhibiting a plurality of detector units (11, 11') working in parallel and a jointly-shared controller (12), wherein the shared controller (12) is configured such that depending on the detection result returned by the respective detector units (11, 11'), an early fire detection signal is emitted to shut off the power supply to the monitored electrical equipment rack(s) (100) and/or actuate an extinguishing gas mechanism (20) in order to introduce extinguishing gas into the monitored electrical equipment rack(s) (100).

20. The apparatus according to claim 19, wherein the jointly-shared controller (12) is configured so as to emit an early fire detection signal when any detection result returned by the respective detector units (11, 11') indicates a fire.

\* \* \* \* \*